(12) United States Patent
Hanyu et al.

(10) Patent No.: US 7,431,988 B2
(45) Date of Patent: Oct. 7, 2008

(54) HARD COATING AND MACHINING TOOL DISPOSED WITH HARD COATING

(75) Inventors: Hiroyuki Hanyu, Toyokawa (JP); Takaomi Toihara, Toyokawa (JP); Hiroaki Sugita, Toyokawa (JP)

(73) Assignee: OSG Corporation, Toyokawa-shi (JP)

( * ) Notice: Subject to any disclaimer, the term of this patent is extended or adjusted under 35 U.S.C. 154(b) by 182 days.

(21) Appl. No.: 11/289,546

(22) Filed: Nov. 30, 2005

(65) Prior Publication Data

US 2006/0115650 A1    Jun. 1, 2006

(30) Foreign Application Priority Data

Dec. 1, 2004    (JP)    ............... 2004-349152

(51) Int. Cl.
*B32B 9/00*    (2006.01)
(52) U.S. Cl. ............... 428/408; 51/307; 51/309; 407/119; 428/212; 428/216; 428/217; 428/325; 428/336; 428/697; 428/698; 428/699; 428/704
(58) Field of Classification Search ............... 428/212, 428/216, 217, 336, 325, 408, 697, 698, 699, 428/704; 51/307, 309; 407/119
See application file for complete search history.

(56) References Cited

U.S. PATENT DOCUMENTS

| | | | | |
|---|---|---|---|---|
| 5,543,210 A | * | 8/1996 | Kullander et al. | 428/217 |
| 5,981,057 A | * | 11/1999 | Collins | 428/408 |
| 6,080,378 A | * | 6/2000 | Yokota et al. | 423/446 |
| 6,846,341 B2 | * | 1/2005 | Middlemiss | 51/307 |
| 6,858,080 B2 | * | 2/2005 | Linares et al. | 423/446 |

FOREIGN PATENT DOCUMENTS

| | | |
|---|---|---|
| JP | A-61-163275 | 7/1986 |
| JP | A-05-092305 | 4/1993 |
| JP | 2519037 B2 | 5/1996 |
| JP | A-08-512362 | 12/1996 |
| JP | 10-146703 A | 6/1998 |
| JP | 2002-79406 A | 3/2002 |
| JP | 2003-145309 A | 5/2003 |
| JP | 2004-193522 A | 7/2004 |
| WO | WO 95/02078 | 1/1995 |

* cited by examiner

*Primary Examiner*—Archene Turner
(74) *Attorney, Agent, or Firm*—Oliff & Berridge, PLC

(57) ABSTRACT

A hard coating that is to be disposed on a surface of a body includes a diamond layer which includes a plurality of diamond grains and is doped with boron, and an outer layer which includes an intermetallic compound and is disposed on the diamond layer by a physical vapor deposition method.

18 Claims, 5 Drawing Sheets

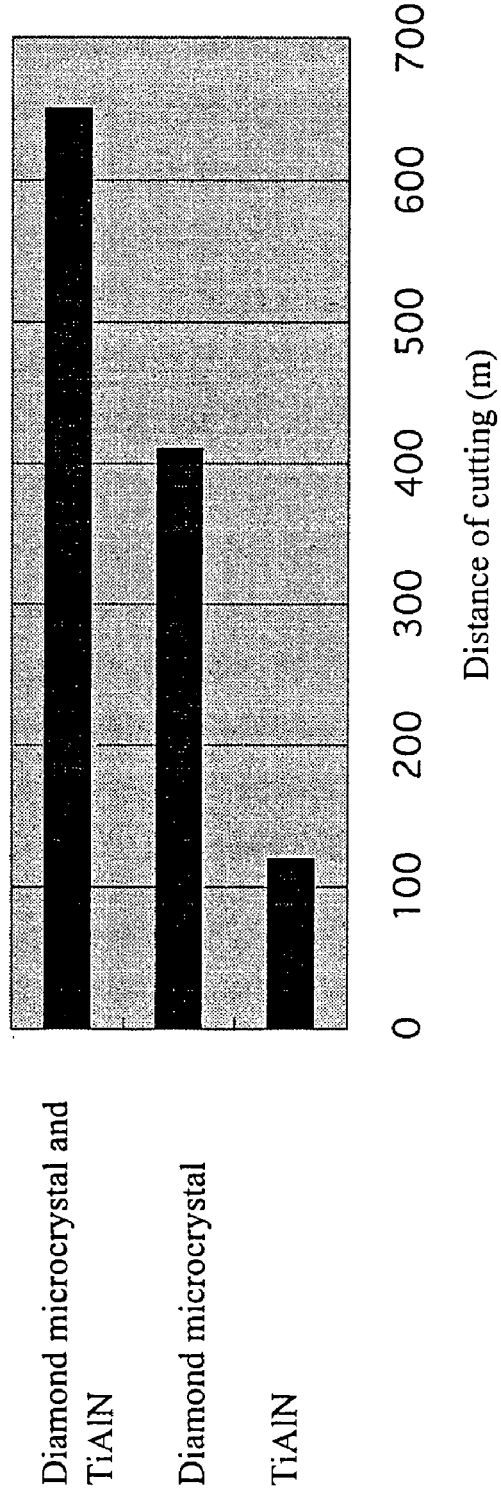

HARD COATING AND MACHINING TOOL DISPOSED WITH HARD COATING

This application is based on Japanese Patent Application No. 2004-349152 filed Dec. 1, 2004, the contents of which are incorporated hereinto by reference.

BACKGROUND OF THE INVENTION

1. Field of the Invention

The present invention relates to a hard coating that is to be disposed on a surface of a body of such as a machining tool, especially, to the art of disposing an outer layer on a diamond layer by the PVD method.

2. Description of Related Art

A diamond-coated tool coated with a diamond coating on the body made of such as cemented carbide is suggested for a cutting tool such as an end mill, a turning tool, a tap, a drill or other tools. JP 2519037B and JP 2002-79406A disclose examples of such tools. Although these diamond-coated tools have very high hardness, superior wear resistance and adhesion resistance, they often does not offer sufficiently high performance in cutting of the composite material including a material of iron series or in cutting of a material with its cutting point at a high temperature due to their low oxidation resistance. Then such as JP 2003-145309A discloses an art to coat a diamond coating with an outer layer including an intermetallic compound of such as TiAlN by such as the PVD (physical vapor deposition) method. JP 2004-193522A and JP 10-146703A disclose an art of doping with boron (B) upon the crystal growth of the diamond by such as the microwave plasma CVD (chemical vapor deposition) method in order to let it have electrical conductivity and to improve it in oxidation resistance.

Doping with boron for the diamond coating disposed on the surface of such as a machining tool body, however, has not been suggested yet. Substantial insulation of diamond itself causes low strength of adhesion as a result of insufficient electrical conductivity characteristics from the early period of the coating process upon disposing an outer layer of such as TiAlN on the diamond coating by the PVD method, and causes insufficient durability as a result of flaking or removal of the outer layer in the early period of cutting.

It is therefore an object of the present invention to provide a hard coating with superior durability by improving the strength of adhesion of the outer layer to the diamond layer by the PVD method.

SUMMARY OF THE INVENTION

The object indicated above may be achieved according to a first aspect of the invention, which provides a hard coating that is to be disposed on a surface of a body comprising a diamond layer which includes a plurality of diamond grains and is doped with boron, and an outer layer which includes an intermetallic compound and is disposed on the diamond layer by a physical vapor deposition method.

The object indicated above may be achieved according to a second aspect of the invention, which provides the hard coating according to the first aspect of the invention, wherein the diamond layer is doped with boron in a ratio of 0.05-10 atomic % of boron.

The object indicated above may be achieved according to a third aspect of the invention, which provides the hard coating according to the first or second aspect of the invention, wherein the diamond layer includes a plurality of diamond microcrystals as the diamond grains, a crystal grain diameter of the diamond microcrystal being not larger than 2 μm.

The object indicated above may be achieved according to a fourth aspect of the invention, which provides the hard coating according to any one of the first through third aspect of the invention, wherein the outer layer consists of at least one layer, each of which is formed of one kind of an intermetallic compound.

The object indicated above may be achieved according to a fifth aspect of the invention, which provides the hard coating according to the any one of first through third aspect of the invention, wherein the outer layer consists of a plurality of layers, each of which includes one kind of an intermetallic compound.

The object indicated above may be achieved according to a sixth aspect of the invention, which provides the hard coating according to the fourth or fifth aspect of the invention, wherein the intermetallic compound is TiAlN. The object indicated above may be achieved according to a seventh aspect of the invention, which provides the hard coating according to the fourth or fifth aspect of the invention, wherein the intermetallic compound is TiCN. The object indicated above may be achieved according to an eighth aspect of the invention, which provides the hard coating according to the fourth or fifth aspect of the invention, wherein the intermetallic compound is TiCrN. The object indicated above may be achieved according to a ninth aspect of the invention, which provides the hard coating according to the fourth or fifth aspect of the invention, wherein the intermetallic compound is TiN. The object indicated above may be achieved according to a tenth aspect of the invention, which provides the hard coating according to the fourth or fifth aspect of the invention, wherein the intermetallic compound is CrN The object indicated above may be achieved according to a eleventh aspect of the invention, which provides the hard coating according to any one of the first through tenth aspect of the invention, wherein the diamond layer has a thickness of 8-20 μm, and the outer layer has a thickness of 1-5 μm.

The object indicated above may be achieved according to a twelfth aspect of the invention, which provides a machining tool for machining a workpiece comprising a body including a machining portion, which is to be brought into contact with the workpiece for machining the workpiece, and the hard coating defined in any one of the first through eleventh aspect of the invention, wherein the hard coating is disposed on a surface of the machining portion of the body.

The object indicated above may be achieved according to a thirteenth aspect of the invention, which provides the machining tool according to the twelfth aspect of the invention, wherein the body is made of cemented carbide.

The object indicated above may be achieved according to a fourteenth aspect of the invention, which provides the hard coating according to the twelfth aspect of the invention, wherein the body is made of ceramics.

The object indicated above may be achieved according to a fifteenth aspect of the invention, which provides the machining tool according to any one of the twelfth through fourteenth aspect of the invention, wherein the machining tool is an end mill. The object indicated above may be achieved according to an sixteenth aspect of the invention, which provides the machining tool according to any one of the twelfth through fourteenth aspect of the invention, wherein the machining tool is a turning tool. The object indicated above may be achieved according to a seventeenth aspect of the invention, which provides the machining tool according to any one of the twelfth through fourteenth aspect of the invention, wherein the machining tool is a tap. The object indicated above may be achieved according to an eighteenth aspect of the invention, which provides the machining tool according to any one of the twelfth through fourteenth aspect of the invention, wherein the machining tool is a drill. The object indicated above may be achieved according to a nineteenth aspect of the invention, which provides the machining tool according to any one of the twelfth through fourteenth aspect of the invention, wherein the machining tool is a form rolling tool.

The boron-doped diamond is a diamond in which one or a plurality of carbon atoms are replaced by one or a plurality of boron atoms and serves as a p-type semiconductor having a positive hole with positive charge. "Atomic % (percent)" is defined as the number of atoms of a particular element present in every hundred atoms within the detection volume. The "atomic %" of boron means a ratio of the number of atoms replaced by boron atoms to the number of the total of the boron atoms and other atoms (that is, all atoms) and it is measured by such as the secondary ion mass spectrometry.

In this hard coating, since the diamond coating disposed on the surface of such as a tool body is doped with boron, the diamond coating procures electrical conductivity. This causes coating with sufficiently electrical conductivity characteristics from the early period of the coating process, and therefore causes high strength of adhesion of the outer layer of the intermetallic compound to the diamond layer upon disposing the outer layer by the PVD method. Furthermore, improvement in oxidation resistance of the diamond layer itself by being doped with boron and the presence or covering of the outer layer cause extensive improvement in oxidation resistance. This provides superior durability by preventing flaking or early wearing of the coating by oxidation in cutting of the composite material including a material of iron series or in cutting of the heat-resistant alloy such as a titanium alloy with the cutting point at a high temperature.

In the third aspect of the invention, the diamond microcrystal causes evenness of the surface comparing to the conventional diamond layer, therefore, causes improvement in evenness of the surface (low coarseness of the surface) of the outer layer on the diamond layer and of the machined surface of the workpiece if applied to the diamond layer on the surface of a machining tool.

In the sixth aspect of the invention, thickness of the diamond layer in a range of 8-20 μm and thickness of the outer layer in a range of 1-5 μm causes improvements in wear resistance due to the diamond layer, sufficient adhesion of the diamond layer to the tool substrate and sufficient adhesion of the outer layer to the diamond layer, therefore, this preferably prevents flaking or removing of the diamond layer and the outer layer.

The machining tool that the above hard coating is disposed on the surface of the body according to the ninth aspect of the invention substantially achieves the effects as described above.

While the hard coating according to the invention is preferably applied to a tool such as a cutting tool, for example, an end mill, a turning tool, a tap and a drill, requiring wear resistance and oxidation resistance, namely, a machining tool with the hard coating thereon, it may be also applied to other use than such tools, for example, to a hard coating for such as a semiconductor apparatus. And it may be applied to other machining tool such as a form rolling tool or a plastically deforming tool. While it is preferably used for machining of iron series material such as a steel material, it may be used for machining of other materials.

While hard tool material such as cemented carbide is preferably used for the body to be coated with hard coating for the machining tool, other tool material such as high-speed steel or ceramics may be used. The predetermined pretreatment as the surface roughening treatment or coating of other coating as a substrate on the surface of the tool body may be conducted for high adhesion.

The CVD (chemical vapor deposition) method is preferably used for coating of the diamond layer, especially the microwave plasma CVD is preferable, while other CVD methods such as the hot filament CVD or radio-frequency plasma CVD method may be used. Conventional various methods for doping the diamond with boron, for example, disclosed in JP 2004-193522A and JP 10-146703A, may be adopted.

Not less than 0.05 atomic % of boron doping (content) is appropriate for the predetermined electric conductivity and not more than 10 atomic % of boron doping is appropriate for maintaining such as wear resistance and hardness of the diamond layer. An embodiment having a continuous or staged increase of doping as approaching the surface of the coating, an embodiment having a multilayer structure mutually laminated with the layer doped with the large amount of boron and the layer doped with the small amount of boron, or other embodiment may be acceptable.

The advantageous thickness of the diamond layer depends upon such as a kind and thickness of the outer layer, for example, the thickness of the diamond layer is appropriately determined 5-25 μm, more preferably 8-20 μm, because the thinner layer than 5 μm does not have such as sufficient wear resistance and the thicker layer than 25 μm is apt to be flaked or causes the rounded edges of the cutting edges unadvantageously. The thickness of the outer layer depends upon such as the thickness of the diamond layer or the material of the outer layer, for example, the thickness of the outer layer is appropriately determined 1-5 μm because the thinner layer than 1 μm cannot sufficiently prevent the reaction between the diamond layer and the iron series material and the thicker layer than 5 μm is apt to be flaked or causes the rounded edges of the cutting edges unadvantageously. The thickness for other use than machining tools may be appropriately determined according to such as the material of the subject to be coated or the object. This invention may include the laminated coating with the diamond layer and the outer layer made of an intermetallic compound one after the other upon the condition that the outer layer is disposed at the top of the layers.

The outer layer comprises the intermetallic compound including such as carbide, for example, aluminum (Al), titanium (Ti), vanadium (V) or chromium (Cr), nitride, carbon nitride or mutual solid solution of these ones, and such as TiAlN, TiCN, TiCrN, TiN and CrN are preferably used. While the outer layer may be constituted of a single layer, it can be constituted of two or more layers of intermetallic compounds. An embodiment of such as approximately 0.2-0.5 μm thickness TiN layer that is superiorly adhered to diamond on the diamond layer and such as approximately 3-4 μm TiAlN layer on the TiN layer, another embodiment of a multilayer structure in which approximately 0.2-0.5 μm thickness TiN and TiAlN are mutually disposed, and other embodiment may be adopted.

It is not necessary for the outer layer to be disposed to cover the whole surface of the diamond layer, and it is sufficient for the outer layer to be disposed on the diamond layer to cover at least the part that is in contact with the surface of the workpiece (such as the workpiece to be cut) upon machining. The arc ion plating method, the sputtering method or the like is preferably used for the PVD method to dispose the outer layer of intermetallic compound.

The diamond microcrystal according to the third aspect of the invention can be formed by repeating of nucleation steps and crystal growth steps as disclosed in JP 2002-79406A. The crystal grain diameter of the diamond microcrystal is preferably determined to be not larger than 2 μm, more preferably not larger than 1 μm. The crystal grain diameter means the maximum diameter as measured in a perpendicular direction to the crystal growth direction. While the crystal grain diameters of not larger than 2 μm of all diamond crystals are preferable, the crystal grain diameters of not larger than 2 μm of at least not smaller than 80% of the diamond crystals are acceptable or sufficient. In general the crystal grain diameter of the diamond crystal is not larger than 2 μm in the perpendicular direction to the crystal growth direction if the length of the diamond crystal in the crystal growth direction is controlled to be not larger than 2 μm. The crystal grain diameter of not larger than 2 μm of the diamond crystal is acceptable or sufficient even if the length of the diamond crystal in the crystal growth direction exceeds 2 μm. The diamond layer of larger than 2 μm coarse crystals may be used for execution of other aspects than the third aspect of the invention.

BRIEF DESCRIPTION OF THE DRAWINGS

FIG. 5A illustrates the condition for the test in durability among the invention having the outer layer of TiAlN disposed on the boron-doped diamond microcrystal layer, the comparative one having the boron-doped diamond microcrystal layer without any outer layer, the conventional one having the layer of TiAlN without any diamond layer upon cutting the gray cast iron;

FIG. 5B illustrates the result of the same test as referred to in FIG. 5A;

DETAILED DESCRIPTION OF EXEMPLARY EMBODIMENTS

Figure 1A:
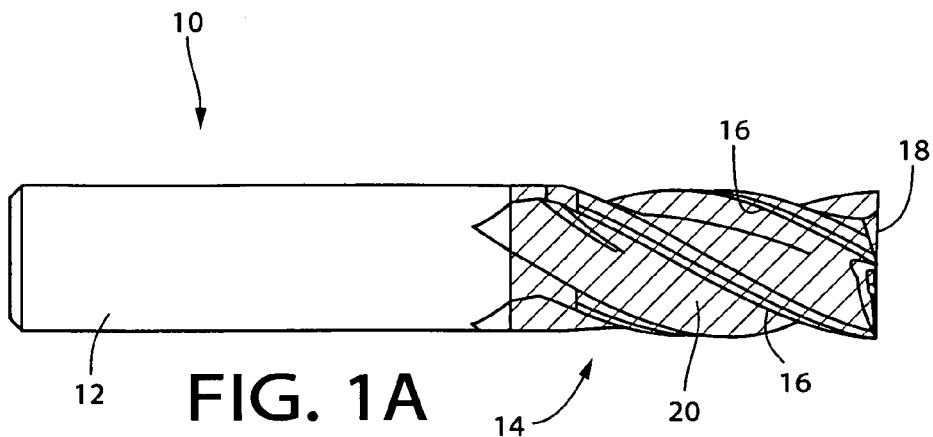
FIG. 1A illustrates an end mill in an embodiment according to the invention in a front view as viewed from the perpendicular direction to the axis of the end mill.
Figure 1B:
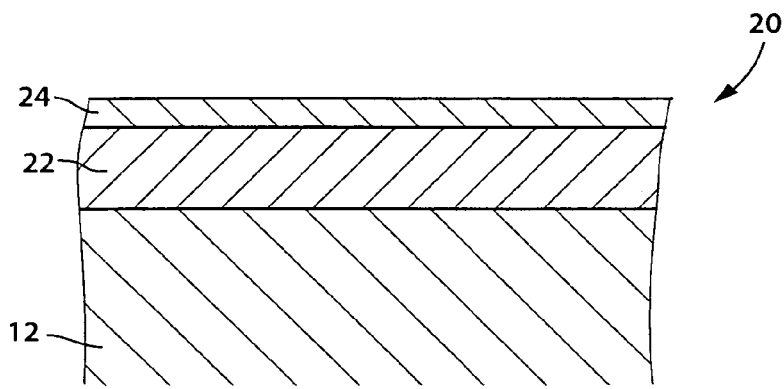
FIG. 1B illustrates an adjacent portion to the surface of a cutting edge of the end mill in FIG. 1A in a sectional view.

Hereinafter, there will be described the present invention by reference to the drawings. FIG. 1A illustrates an end mill 10 according to the invention in a front view as viewed from the perpendicular direction to the axis of the end mill 10 and FIG. 1B illustrates an adjacent portion to the surface of a cutting edge 14 of the end mill 10 in FIG. 1A in a sectional view. The end mill 10 is a square end mill having four cutting edges. A tool substrate 12 or a body of the end mill 10 is made of cemented carbide and the tool substrate 12 has a shank and the cutting part 14 that are integrally formed. The cutting part 14 corresponds to the machining portion or a main body and is provided with peripheral cutting edges 16 and end cutting edges 18 as cutting edges. The cutting part 14 is coated with the hard coating 20. The oblique lines in FIG. 1A show the area corresponding to the surface of the tool substrate 12 coated with the hard coating 20.

The hard coating 20 includes the diamond layer 22 that is disposed on the surface of the tool substrate 12 and the outer layer 24 that is disposed on the diamond layer 22. The diamond layer 22 includes the diamond microcrystal whose crystal grain diameter is not larger than 1 μm, and is doped with boron of 0.05-10 atomic %, for example, approximately 5.0 atomic %. The thickness of the diamond layer 22 ranges 8-20 μm, for example, is approximately 15 μm. The outer layer 24 is constituted of the single intermetallic compound, such as TiAlN, in this embodiment, and is disposed in thickness of 1-5 μm, for example, approximately 4 μm.

The tool substrate 12 having the peripheral cutting edges 16 and end cutting edges 18 is formed by such as grinding of a material of cemented carbide, then the surface of the cutting part 14 of the tool substrate 12 is treated with the surface roughening treatment and this causes high adhesion of the diamond layer 22 to complete the end mill 10. For the surface roughening treatment, for example, a method utilizing chemical corroding such as electropolishing or sand blasting with such as abrasive grains of SiC or the like is appropriately adopted. Then the roughened surface of the cutting part 14 is coated with the diamond layer 22 by the vapor phase synthesis method, for example, by the microwave plasma CVD method using the microwave plasma CVD apparatus in FIG. 2 to generate and grow the diamond particles or crystals with doping with boron.

Figure 2:
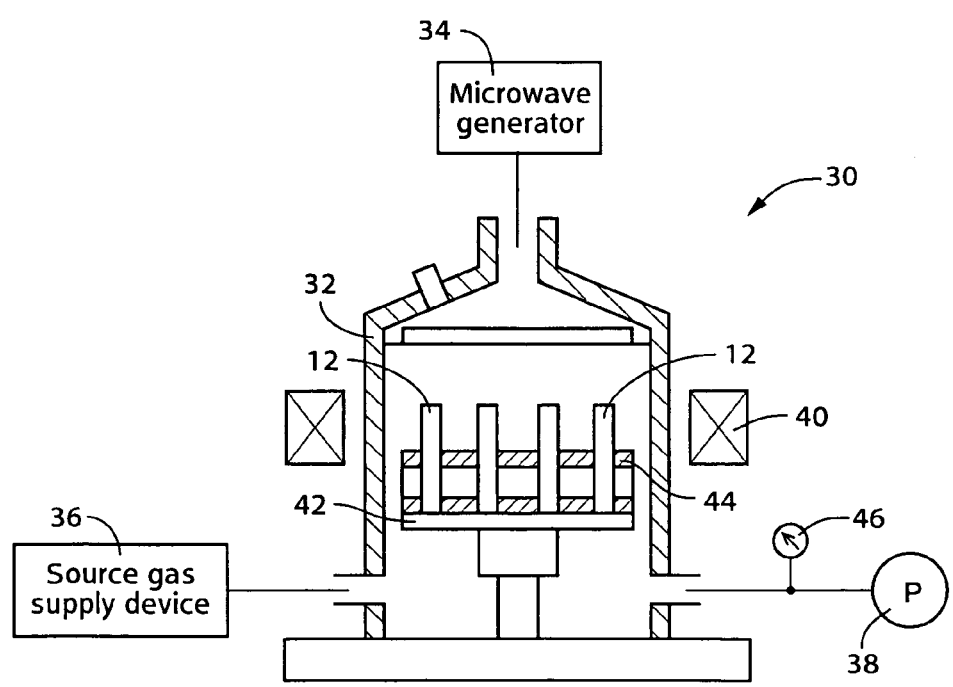
FIG. 2 illustrates an example of the microwave plasma CVD apparatus used for forming the diamond layer in a diagram.

The microwave plasma CVD apparatus 30 shown in FIG. 2 is provided with a reactor 32, a microwave generator 34, a source gas supply device 36, a vacuum pump 38 and an electromagnetic coil 40. In the cylindrical reactor 32 is provided a table 42, a workpiece holder 44 on the table 42 holds a plurality of tool substrates 12 to be coated with the diamond layer 22 and each of the tool substrate 12 is arranged so that the cutting part 14 of the tool substrate 12 is at the upper side. The microwave generator 34 generates such as 2.45 GHz microwave and the introduced microwave into the reactor 32 causes the tool substrate 12 to be heated. Controlling of the power of the microwave generator 34 allows the regulation of the temperature for heating.

The source gas supply device 36 supplies source gases such as methane ($CH_4$), hydrogen (H) and carbon monoxide (CO) to the reactor 32 and the device 36 is provided with such as a gas container for each of the source gas, a flow control valve for controlling the flow of the source gas and a flowmeter. In this embodiment the device 36 is capable of supplying the source gas mixed with such as a liquid of methanol in which boron oxide is dissolved for doping with boron. The vacuum pump 38 is provided for depressurizing by sucking a gas in the reactor 32. Feedback control of such as the motor current of the vacuum pump 38 allows the value of the pressure in the reactor 32 measured by the pressure gauge 46 to be maintained at the predetermined value of the pressure. The electromagnetic coil 40 is provided annularly in the outer circumference of the reactor 32 as surrounding the reactor 32.

Figure 3:
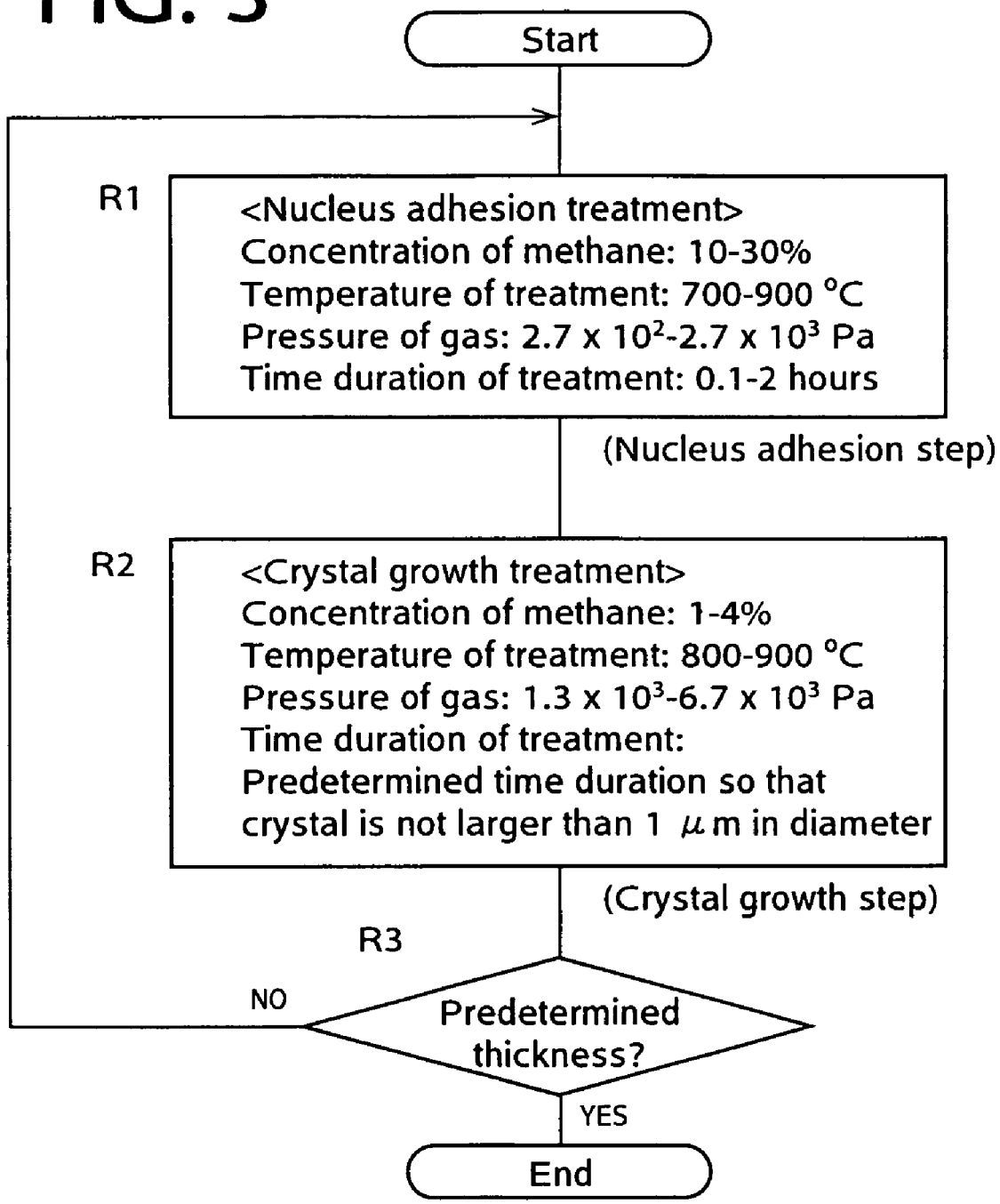
FIG. 3 illustrates a flowchart showing steps for forming the diamond microcrystal layer by the apparatus in FIG. 2.

The coating treating of the diamond layer 22 by the microwave plasma CVD apparatus 30 includes the nucleus adhesion step R1 and the crystal growth step R2 in FIG. 3. In step R1 of the nucleus adhesion step, after the regulation of the methane and hydrogen flows for the predetermined value in the range of 10-30% of methane in concentration, the regulation of the operation of the microwave generator 34 for the predetermined temperature on the surface of the tool substrate 12 in the range of 700-900° C., and the regulation of the operation of the vacuum pump 38 for the predetermined pressure in the reactor 32 in the range of $2.7 \times 10^2$–$2.7 \times 10^3$ Pa, the condition is maintained with the predetermined value of methane in concentration, at the predetermined temperature and under the predetermined pressure for 0.1-2 hours. This step R1 provides the deposition of the nucleus layer as the start point of the diamond crystal growth on the surface of the tool substrate 12 or on the surfaces of a plurality of diamond crystals that the crystal has grown in the crystal growth treatment in step R2.

In step R2 of the crystal growth step, after the regulation of the methane and hydrogen flows for the predetermined value in the range of 1-4% of methane in concentration, the regulation of the operation of the microwave generator 34 for the predetermined temperature on the surface of the tool substrate 12 in the range of 800-900° C., and the regulation of the operation of the vacuum pump 38 for the predetermined pressure in the reactor 32 in the range of $1.3 \times 10^3$–$6.7 \times 10^3$ Pa, the condition is maintained with the predetermined value of methane in concentration, at the predetermined temperature and under the predetermined pressure for the predetermined duration of time. That predetermined duration of time is determined such that the crystal grain diameter of the diamond crystal is maintained not larger than 1 μm in diameter, in other words, it is shorter than another predetermined duration of time that the diamond crystal grows to 1 μm in length, namely, in the length dimension in the direction of crystal growth. In the crystal growth treatment of this embodiment the crystal grain diameter of the diamond crystal in the plane substantially perpendicular to the crystal growth direction is maintained not larger than 1 μm if the length dimension in the crystal growth direction is not larger than 1 μm.

In the next step R3 it is judged by such as the repeated times of step R2 whether the thickness of the diamond layer 22 formed on the surface of the tool substrate 12 with the crystal growth treatment reaches the predetermined value, for example, 20 μm in this embodiment, and the treatments in steps R1 and R2 is repeated until the thickness reaches the predetermined value. In the treatment of step R1 the diamond crystal growth stops and on the grown crystals a new layer of the nucleus is formed. Later in the crystal growth treatment, step R2, the diamond crystals under the layer of the nucleus do not grow, a new diamond crystal grows from the new nucleus as the start point, and therefore the tool substrate 12 is coated with the diamond layer 22 of microcrystals of not larger than 1 μm both in diameter and length, namely, of not larger than 1 μm crystal grain diameter and crystal length.

In the coating treatment the diamond layer 22 is doped with boron by supplying the source gas such as hydrogen mixed with the liquid of methanol dissolved with the boron oxide to the reactor 32 in the predetermined flow rate. The regulation of the doping amount of boron is achieved by controlling the flow rate of the supply of the liquid with boron oxide dissolved.

Figure 4:
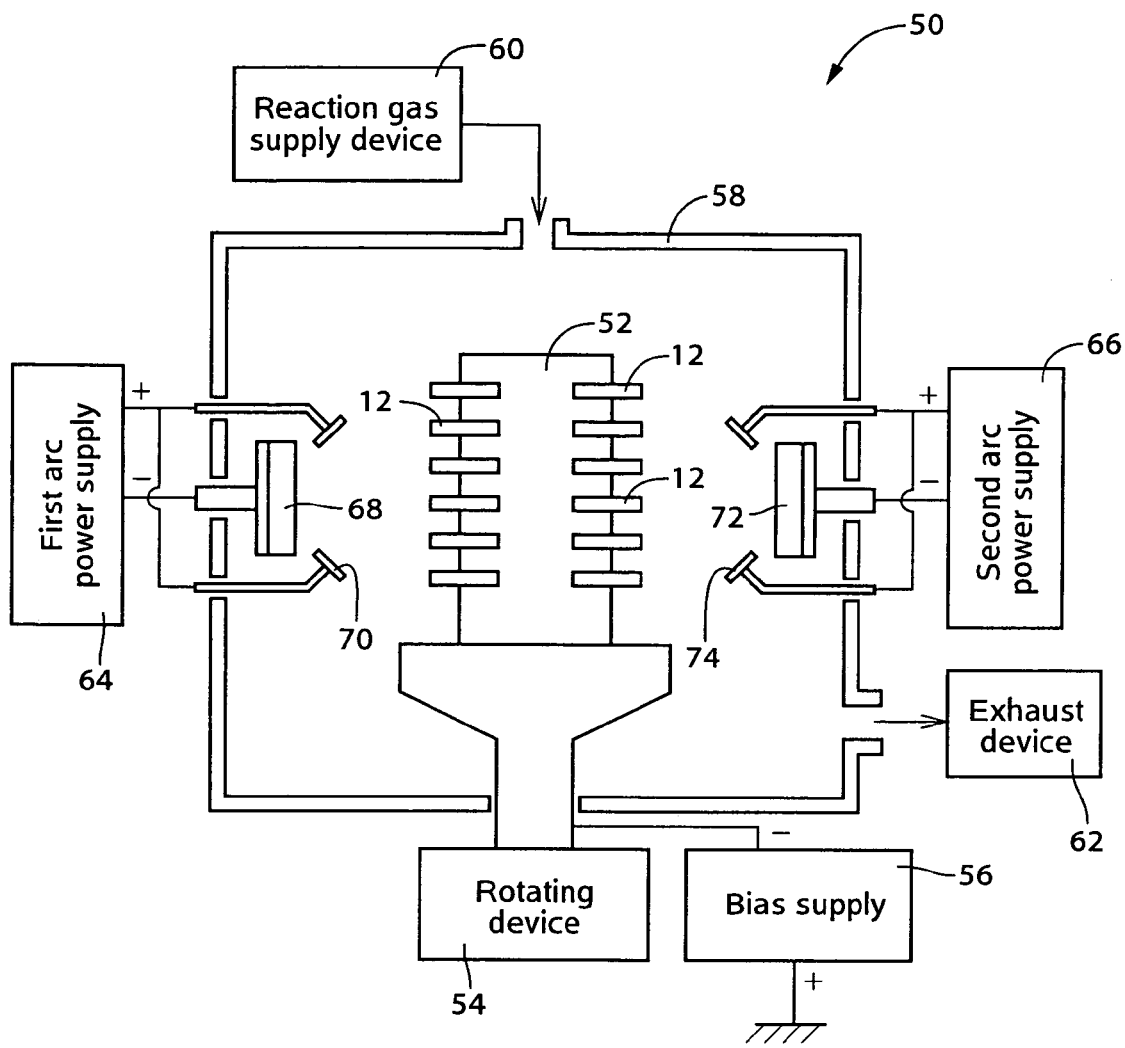
FIG. 4 illustrates an example of the arc ion plating apparatus used for forming the outer layer of TiAlN in a diagram.

Further a TiAlN layer as the outer layer 24 is disposed on the diamond layer 22 by the PVD method such as the arc ion plating method. FIG. 4 illustrates an example of the arc ion plating apparatus 50 used for forming the outer layer 24 of TiAlN in a diagram. The arc ion plating apparatus 50 is provided with a workpiece holder 52 which holds a plurality of workpiece, that is, the tool substrate 12 having the cutting parts 14 coated with the diamond layer 22, a rotating device 54 which rotates the workpiece holder 52 on a substantially vertical axis of a rotating center, a bias supply 56 which applies a negative bias voltage to the tool substrate 12, a chamber 58 serving as a container for treatment including the tool substrate 12 and others within, a reaction gas supply device 60 supplying a predetermined reaction gas into the chamber 58, an exhaust device 62 exhausting a gas in the chamber 58 by such as a vacuum pump for depressurizing, a first arc power supply 64, a second arc power supply 66 and others. The workpiece holder 52 has a cylindrical shape or a polyangular prism shape with its center on the substantially vertical axis of the rotating center and has a plurality of the tool substrates 12 radially as seen from the upper direction with their cutting parts 14 substantially horizontally protruding outwards. For the composition of the outer layer 24 to be disposed the reaction gas supply device 60 selects to have various gas tanks, for example, a nitrogen ($N_2$) gas tank for nitride, a hydrocarbon (such as $CH_4$ and $C_2H_2$) gas tank for carbide or both tanks for carbon nitride. In this embodiment with the nitride coating of TiAlN as the outer layer 24 the reaction gas supply device 60 has at least a nitrogen gas tank for supplying nitrogen gas.

Supplying a current from the first arc power supply 64 vaporizes titanium Ti from a first evaporation source 68 of titanium Ti included in the outer layer 24 or TiAlN layer by applying a predetermined arc current between the first evaporation source 68 serving as a cathode and an anode 70 and by arc discharge. The vaporized titanium Ti becomes a positive metal ion and adheres to the surface of the diamond layer 22 on the tool substrate 12 that a negative bias voltage is applied to. Supplying a current from the second arc power supply 66 vaporizes aluminum Al from a second evaporation source 72 of aluminum Al included in the outer layer 24 or TiAlN layer by applying a predetermined arc current between the second evaporation source 72 serving as a cathode and an anode 74 and by arc discharge. The vaporized aluminum Al becomes a positive metal ion and adheres to the surface of the diamond layer 22 on the tool substrate 12 that a negative bias voltage is applied to. TiAl alloy may be used for a target, namely, the evaporation source.

The TiAlN layer is disposed by exhausting in advance by the exhaust device 62 and supplying nitrogen gas from the reaction gas supply device 60 to maintain the pressure in the chamber 58 at a predetermined pressure (such as approximately $1.33 \times 5 \times 10^{-1}$ Pa–$1.33 \times 40 \times 10^{-1}$ Pa), applying a predetermined bias voltage (such as ranging from approximately $-50$ V to approximately $-150$ V) to the tool substrate 12 by the bias supply 56, and rotating the workpiece holder 52 by the rotating device 54 at a predetermined rotating speed. That is, the first arc power supply 64 and second arc power supply 66 are both switched on (voltage is applied) to vaporize titanium Ti by arc discharge between the first evaporation source 68 and the anode 70 and to vaporize aluminum Al by arc discharge between the second evaporation source 72 and the anode 74, and this allows the outer layer 24 of TiAlN of the predetermined thickness (approximately 4 μm in this embodiment) to be formed on the diamond layer 22.

Since the diamond layer 22 disposed on the end mill 10 of this embodiment is doped with approximately 5.0 atomic % of boron, the diamond layer 22 has electrical conductivity. This allows forming or disposing of the outer layer 24 of TiAlN on the diamond layer 22 by the PVD method with sufficiently electrical conductivity characteristics from the early period of the coating process and it therefore causes high strength of adhesion of the outer layer 24 to the diamond layer 22. Furthermore, improvement in oxidation resistance of the diamond layer 22 itself by being doped with boron and the presence or covering of the outer layer 24 cause extensive improvement in oxidation resistance. This provides superior durability by preventing flaking or early wearing of the outer layer 24 by oxidation in cutting of the composite material including a material of iron series or in cutting of the heat-resistant alloy such as a titanium alloy with the cutting point at a high temperature.

The 15 μm thickness of the diamond layer 22 and 4 μm thickness of the outer layer 24 cause preferable advancements in wear resistance by the diamond layer 22, in adhesion of the diamond layer 22 to the tool substrate 12, and in adhesion of the outer layer 24 to the diamond layer 22. This preferably prevents flaking or removal of these layers. Furthermore, this appropriate roundness of the cutting edges of the peripheral cutting edges 16 and end cutting edges 18 causes advancement in cutting performance.

The diamond layer 22 having microcrystals whose crystal grain diameter is not larger than 1 μm in this embodiment has the even surface comparing to the conventional diamond layer. This causes advancement in evenness (or lowering in coarseness of the surface) of the outer layer 24 disposed on the diamond layer 22 and lowering in coarseness of the machined surface.

FIG. 5A illustrates the condition for the test of a square end mill having two cutting edges in durability among the present invention, the same hard coating as the hard coating 20, having the outer layer of TiAlN disposed on the boron-doped diamond microcrystal layer (Diamond Microcrystal and TiAlN), the comparative one having the boron-doped diamond microcrystal layer without any outer layer (Diamond Microcrystal), the conventional one having the layer of TiAlN without any diamond layer (TiAlN) upon cutting the gray cast iron (FC 250). FIG. 5B illustrates the result of the same test as referred to in FIG. 5A. FIG. 5B shows that the durability of the present invention (Diamond Microcrystal and TiAlN) indicated by the upper bar in the graph is approximately five times that of the conventional one (TiAlN) indicated by the lower bar, and is approximately one and a half times that of the comparative one (Diamond Microcrystal) indicated by the middle bar.

Figure 6:
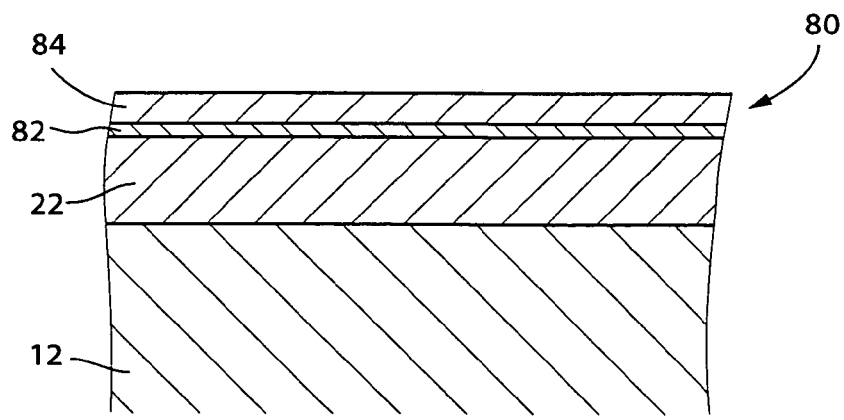
FIG. 6 illustrates an adjacent portion to the surface of a cutting edge of the end mill in another embodiment of the hard coating of the invention in a sectional view in the same way as FIG. 1B.

FIG. 6 illustrates a hard coating having a different structure from that in FIGS. 1A and 1B in a sectional view in the same way as FIG. 1B. The upper layer 80 of this hard coating consists of two layers, that is, a TiN layer 82 of the thickness of approximately 0.3 μm disposed on the diamond layer 22, and a TiAlN layer 84 of the thickness of approximately 4 μm disposed on the TiN layer 82. These TiN layer 82 and TiAlN layer 84 are both disposed by the arc ion plating method as well as the outer layer 24.

This combination of the TiN layer 82 that is superior in adhesion to the diamond material and disposed on the diamond layer 22, and the TiAlN layer 84 disposed on the TiN layer 82 causes further adhesion of the outer layer 80 consisting of the TiN layer 82 and the TiAlN layer 84 to the diamond layer 22 and further fixation. This further preferably prevents flaking or removal upon cutting.

Figure 7:
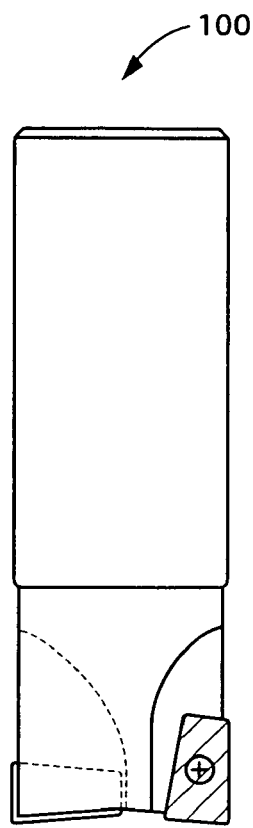
FIG. 7 illustrates a turning tool in an embodiment according to the invention.
Figure 8:
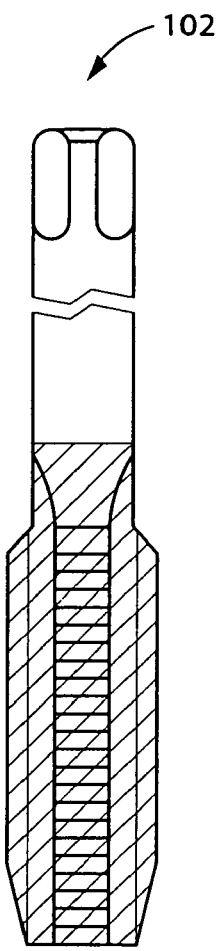
FIG. 8 illustrates a tap in an embodiment according to the invention.
Figure 9:
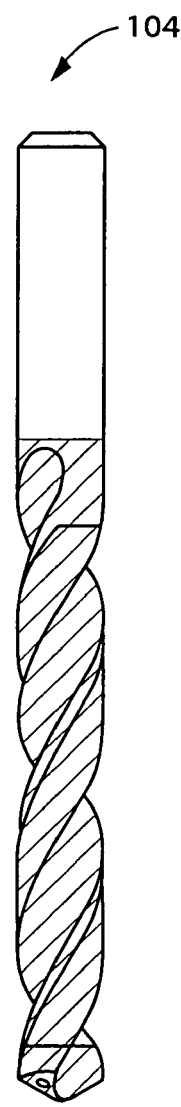
FIG. 9 illustrates a drill in an embodiment according to the invention.
Figure 10:
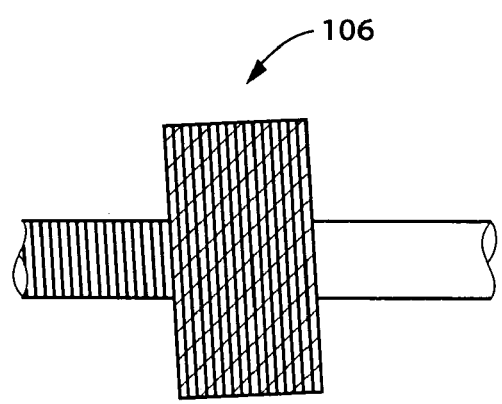
FIG. 10 illustrates a form rolling tool (plastically deforming tool) in an embodiment according to the invention.

FIG. 7 illustrates a turning tool 100 in an embodiment according to the invention. FIG. 8 illustrates a tap 102 in an embodiment according to the invention. FIG. 9 illustrates a drill 104 in an embodiment according to the invention. FIG. 10 illustrates a form rolling tool (or plastically deforming tool) 106 in an embodiment according to the invention. The oblique lines in these FIGS. 7-10 show the areas corresponding to the surface coated with the hard coating 20.

It is to be understood that the present invention may be embodied with other changes, improvements, and modifications that may occur to a person skilled in the art without departing from the scope and spirit of the invention defined in the appended claims.

What is claimed is:

1. A hard coating that is to be disposed on a surface of a body comprising:
    a diamond layer which includes a plurality of diamond grains and is doped with boron; and
    an outer layer which includes an intermetallic compound and is disposed on the diamond layer by a physical vapor deposition method,
    wherein the diamond layer includes a plurality of diamond microcrystals as the diamond grains, a crystal grain diameter of the diamond microcrystal being not larger than 2 μm.

2. The hard coating according to claim 1, wherein the diamond layer is doped with boron in an amount of 5-10 atomic %.

3. The hard coating according to claim 1, wherein the outer layer includes of at least one layer, each of which is formed of one kind of the intermetallic compound.

4. The hard coating according to claim 3, wherein the intermetallic compound is TiAlN.

5. The hard coating according to claim 3, wherein the intermetallic compound is TiCN.

6. The hard coating according to claim 3, wherein the intermetallic compound is TiCrN.

7. The hard coating according to claim 3, wherein the intermetallic compound is TiN.

8. The hard coating according to claim 3, wherein the intermetallic compound is CrN.

9. The hard coating according to claim 1, wherein the outer layer consists of a plurality of layers, each of which includes one kind of the intermetallic compound.

10. The hard coating according to claim 1, wherein the diamond layer has a thickness of 8-20 μm, and the outer layer has a thickness of 1-5 μm.

11. A machining tool for machining a workpiece comprising:
    a body including a machining portion, which is to be brought into contact with the workpiece for machining the workpiece; and
    the hard coating defined in claim 1,
    wherein the hard coating is disposed on a surface of the machining portion of the body.

12. The machining tool according to claim 11, wherein the body is made of cemented carbide.

13. The machining tool according to claim 11, wherein the body is made of ceramics.

14. The machining tool according to claim 11, wherein the machining tool is an end mill.

15. The machining tool according to claim 11, wherein the machining tool is a turning tool.

16. The machining tool according to claim 11, wherein the machining tool is a tap.

17. The machining tool according to claim 11, wherein the machining tool is a drill.

18. The machining tool according to claim 11, wherein the machining tool is a form rolling tool.

* * * * *